(12) United States Patent
Imura

(10) Patent No.: US 11,284,549 B2
(45) Date of Patent: Mar. 22, 2022

(54) COMPONENT MOUNTING MACHINE

(71) Applicant: FUJI CORPORATION, Chiryu (JP)

(72) Inventor: Jinya Imura, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/643,908

(22) PCT Filed: Sep. 7, 2017

(86) PCT No.: PCT/JP2017/032222
§ 371 (c)(1),
(2) Date: Mar. 3, 2020

(87) PCT Pub. No.: WO2019/049253
PCT Pub. Date: Mar. 14, 2019

(65) Prior Publication Data
US 2020/0275591 A1    Aug. 27, 2020

(51) Int. Cl.
*H05K 13/04*      (2006.01)
*H05K 13/08*      (2006.01)
(Continued)

(52) U.S. Cl.
CPC .......... *H05K 13/0413* (2013.01); *G06T 7/74* (2017.01); *H05K 1/0266* (2013.01);
(Continued)

(58) Field of Classification Search
CPC . H05K 13/0413; H05K 13/0409; H05K 13/04
See application file for complete search history.

(56) References Cited

U.S. PATENT DOCUMENTS

| | | | |
|---|---|---|---|
| 6,334,840 B1 * | 1/2002 | Asai | H05K 13/0409 483/1 |
| 6,640,431 B1 * | 11/2003 | Yoriki | H05K 13/0409 29/834 |
| 2006/0200973 A1 * | 9/2006 | Imafuku | H05K 13/0853 29/739 |

FOREIGN PATENT DOCUMENTS

| | | |
|---|---|---|
| JP | 2002-171093 A | 6/2002 |
| JP | 2004-311599 A | 11/2004 |

(Continued)

OTHER PUBLICATIONS

International Search Report dated Dec. 5, 2017 in PCT/JP2017/032222 filed Sep. 7, 2017, 1 page.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounting machine used for effectively avoiding interference between a head main body and a station during exchange of a component holding tool attached to the head main body, the component mounting machine including a head main body to detachably hold a component holding member to hold a component; a head moving mechanism to move the head main body; a station attached to the component mounting machine main body, and to hold an exchange-use component holding member; a station moving mechanism to move the station; and a control device configured to use the station moving mechanism to change a height position in the raising and lowering direction of the station during exchange of the component holding member to be attached to the head main body in accordance with a height position in the raising and lowering direction of the head main body.

2 Claims, 8 Drawing Sheets

(51) Int. Cl.
*H05K 1/02* (2006.01)
*G06T 7/73* (2017.01)
*H05K 13/00* (2006.01)

(52) U.S. Cl.
CPC ..... *H05K 13/0061* (2013.01); *H05K 13/0409* (2018.08); *H05K 13/089* (2018.08)

(56) References Cited

FOREIGN PATENT DOCUMENTS

| JP | 2004311599 A | * | 11/2004 |
| JP | 2013-58510 A | | 3/2013 |
| WO | WO 2017/013733 A1 | | 1/2017 |
| WO | WO 2017/077645 A1 | | 5/2017 |

* cited by examiner

| Head raising and lowering position H | Station height position |
|---|---|
| Hu | S1 |
| Hd | S0 |

COMPONENT MOUNTING MACHINE

TECHNICAL FIELD

This specification relates to a component mounting machine.

BACKGROUND ART

Conventionally, there are component mounting machines including a component mounting head for picking up a component and mounting it on a board (for example, see patent literature 1 and 2). The component mounting head includes: a head main body; a suction nozzle; and a nozzle raising and lowering mechanism. The head main body is attached to the base of the component mounting machine. The suction nozzle is removably attached to the head main body. With the suction nozzle attached to the head main body, the head main body is movable in a horizontal direction with respect to the base. The nozzle raising and lowering mechanism has a raising and lowering shaft which is held by the head main body so as to be raised and lowered. The suction nozzle is attached to a raising and lowering shaft. The nozzle raising and lowering mechanism moves the raising and lowering shaft up and down with respect to the head main body so as to move the suction nozzle up and down with respect to the head main body in order to pick up and mount a component.

The component mounting machine described in the above-mentioned patent literature 1 has a head raising and lowering mechanism that uses a servo motor or the like having a large degree of control freedom. The head raising and lowering mechanism has a raising and lowering member that is held on the base so as to be able to move up and down. The head main body is attached to this raising and lowering member. The head raising and lowering mechanism moves the raising and lowering member up and down with respect to the base of the component mounting machine, thereby raising and lowering the head main body with respect to the base. Therefore, with this component mounting machine, since the raising and lowering of the suction nozzle with respect to the base can be realized over a wide range by the raising and lowering by the nozzle raising and lowering mechanism and the raising and lowering of the head main body by the head raising and lowering mechanism, it is possible to appropriately and reliably perform pickup and mounting using the suction nozzle in accordance with the height of the component.

Further, the component mounting machine disclosed in the above-mentioned patent literature 2 has a nozzle station for storing exchange-use suction nozzles, and a station raising and lowering mechanism for raising and lowering the nozzle station relative to the base. The station raising and lowering mechanism has a raising and lowering member that is held by the base such that raising and lowering is possible. The nozzle station is attached to this raising and lowering member. The station raising and lowering mechanism moves the raising and lowering member up and down with respect to the base of the component mounting machine to raise and lower the nozzle station with respect to the base. The nozzle station is held at the lower end position to avoid interfering with the operation of the suction nozzle during pickup and mounting using the suction nozzle and is positioned at the upper end position during exchange of suction nozzles and so on.

CITATION LIST

Patent Literature

Patent literature 1: JP-A-2002-171093
Patent literature 1: International publication WO2017/013733

BRIEF SUMMARY

Technical Problem

However, when a component mounting machine has a configuration in which a head main body can be raised and lowered with respect to the base by a head raising and lowering mechanism and a nozzle station can be raised and lowered with respect to the base by a station raising and lowering mechanism, if the nozzle station is constantly positioned at the upper end position when suction nozzles are exchanged, the following inconvenience occurs. Specifically, when a suction nozzle is exchanged from a position where the head main body is positioned at the lower end for mounting a low-height component on a board, a situation may occur in which interference occur between the tip of the suction nozzle attached to the head main body and the nozzle station positioned at the upper end. As a method for avoiding such interference, it is conceivable to raise the head main body from the lower end to the upper end using the head raising and lowering mechanism while the nozzle station is positioned at the upper end position, but this interference avoiding method requires the head main body to be raised unnecessarily for exchanging the suction nozzle. Accordingly, to avoid interference between the suction nozzle and the nozzle station, it is not appropriate to position the nozzle station at the upper end position at all times.

Here, it is conceivable to position the nozzle station at the lower end position when exchanging the suction nozzle. If the nozzle station is positioned at the lower end position, it is not necessary to raise the head main body to the upper end in order to exchange the suction nozzle from the state in which the head main body is positioned at the lower end, such that a unnecessary raising operation of the head main body for exchanging the suction nozzle can be avoided. However, if the nozzle station is positioned in the lower end position when the suction nozzle is exchanged from a state in which the head main body is positioned at the upper end for mounting a component having a high component height on the board, the head main body needs to be lowered from the upper end to the lower end by the head raising and lowering mechanism after the head main body has been positioned at the upper end and moved away from the board while avoiding interference with a component having a high component height on the board. For this reason, the length of travel of the head main body becomes long, and the length of time required for exchanging the suction nozzle becomes long.

It is an object of the present specification to provide a component mounting machine capable of efficiently exchanging a suction nozzle attached to a head main body while reliably avoiding interference between the head main body and a nozzle station that stores exchange-use suction nozzles.

Solution to Problem

Disclosed herein is a component mounting machine including: a head main body attached to a component mounting machine main body to be capable of being raised and lowered, and configured to detachably hold a component holding member configured to hold a component; a head moving mechanism configured to move the head main body with respect to the component mounting machine main body in a raising and lowering direction; a station attached to the component mounting machine main body to be capable of being raised and lowered, and configured to hold an exchange-use component holding member; a station moving mechanism configured to move the station with respect to the component mounting machine main body in the raising and lowering direction; and a control device configured to use the station moving mechanism to change a height position in the raising and lowering direction of the station during exchange of the component holding member to be attached to the head main body in accordance with a height position in the raising and lowering direction of the head main body.

According to the present disclosure, the station moving mechanism is used to change a height position in the raising and lowering direction of the station during exchange of the component holding member to be attached to the head main body in accordance with a height position in the raising and lowering direction of the head main body. Therefore, regardless of the raising and lowering position of the head main body during exchange of the component holding member, the distance between the component holding member attached to the head main body and the station in the raising and lowering direction can be shortened as much as possible without allowing interference between the head main body or the component holding member and the station. Accordingly, it is possible to efficiently exchange a component holding member attached to the head main body while reliably avoiding interference between the head main body and the station.

DESCRIPTION OF EMBODIMENTS

1. Component Mounting Machine Configuration

Figure 1:
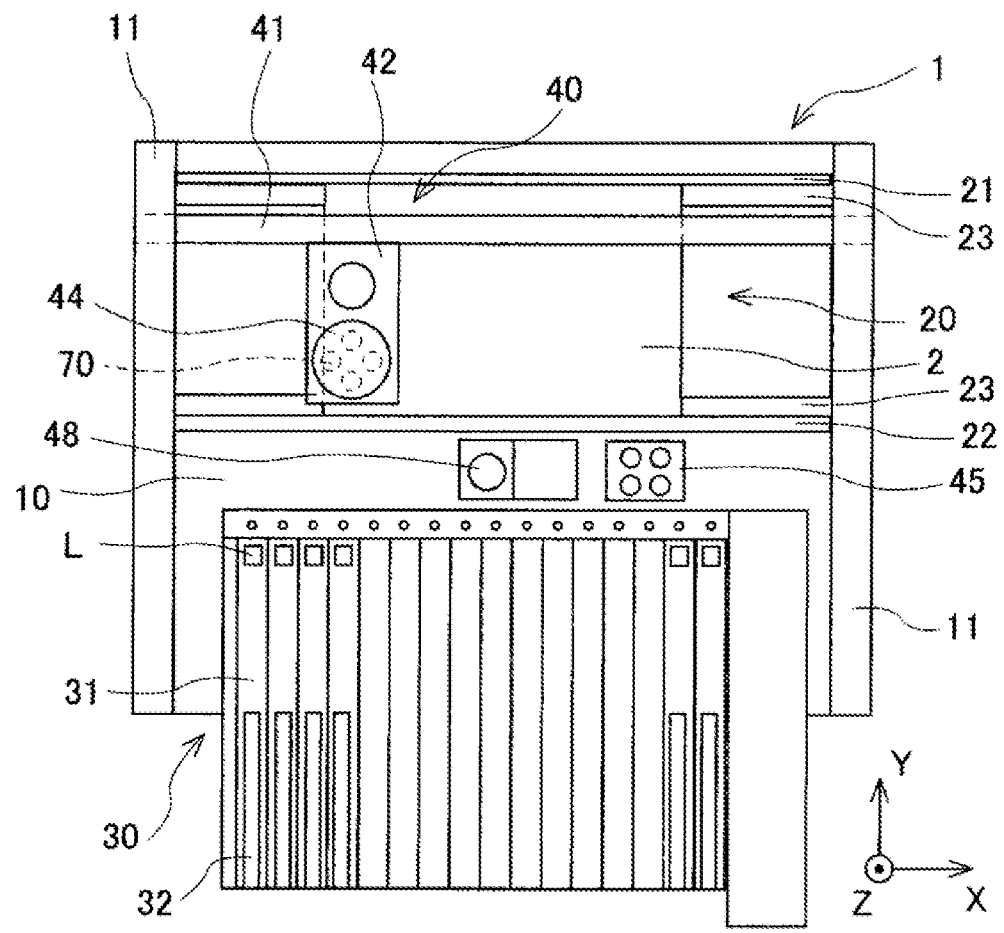
FIG. 1 is a plan view of a component mounting machine according to an embodiment.

The configuration of component mounting machine 1 according to an embodiment will be described referring to FIGS. 1 to 9. Component mounting machine 1 is a device for mounting a component on board 2 such as a circuit board. As shown in FIG. 1, the component mounting machine 1 includes board conveyance device 20, component supply device 30, and component transfer device 40. Each of board conveyance device 20, component supply device 30, and component transfer device 40 is mounted on main body section 10, which is the base of component mounting machine 1.

Board conveyance device 20 is a device for conveying board 2. Board conveyance device 20 includes pair of guide rails 21 and 22, conveyor belt 23, and a clamp device (not shown). The pair of guide rails 21 and 22 are arranged in parallel with each other with a space therebetween. Guide rails 21 and 22 guide board 2 in conveyance direction X. Conveyor belt 23 is a belt member on which board 2 can be mounted, and is provided to be rotatable by an electric motor or the like. Board 2 is conveyed in conveyance direction X by conveyor belt 23 while being guided by pair of guide rails 21 and 22. The clamp device is arranged on conveyor belt 23. When board 2 has been conveyed to a predetermined component mounting position by conveyor belt 23, it is positioned by a clamp device. Guide rails 21 and 22, conveyor belt 23, and the clamp device of board conveyance device 20 can be exchanged as appropriate according to the type, size, shape, and the like of board 2.

Component supply device 30 is a device for supplying components to be mounted on board 2 to pickup position L. Component supply device 30 includes component feeder 31. Component feeder 31 is detachably and interchangeably held in a slot provided on main body section 10 of component mounting machine 1. Component feeder 31 detachably and rotatably holds reel 32 on which carrier tape containing multiple components is wound. Reels 32 are provided for each type of component. Component feeder 31 drives the carrier tape wound around reel 32 toward pickup position L by rotation of an electric motor.

Figure 2:
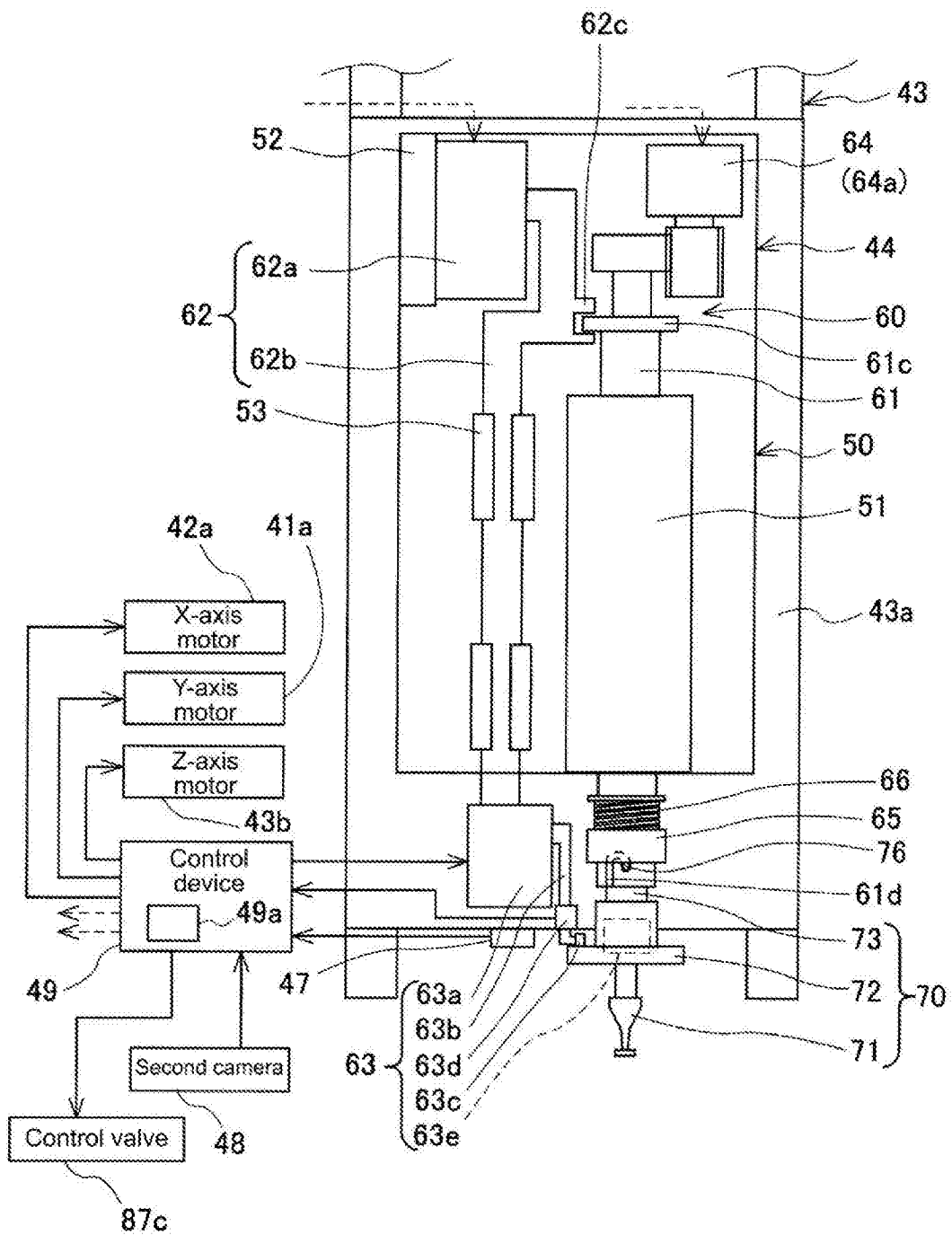
FIG. 2 is a configuration diagram including a state of a mounting head and surrounding items of a component transfer device in the component mounting machine of the embodiment seen from a sideways direction.

Component transfer device 40 is a device for transferring a component supplied to pickup position L by component supply device 30 to board 2 positioned at a predetermined component mounting position by board conveyance device 20. As shown in FIG. 2, component transfer device 40 includes Y-axis slider 41, X-axis slider 42, Z-axis moving mechanism 43, mounting head 44, nozzle station 45, nozzle changer 46, first camera 47, second camera 48, and control device 49.

Guide rail 11 extends in a direction orthogonal to the conveyance direction X of board 2 by board conveyance device 20 (hereinafter, referred to as an orthogonal direction Y) and is attached to main body section 10 of component mounting machine 1. Y-axis slider 41 is movable along guide rail 11 with respect to main body section 10 of component mounting machine 1 by means of Y-axis servo motor 41a. X-axis slider 42 is attached to Y-axis slider 41 so as to be movable in conveyance direction X. As Y-axis slider 41 moves in orthogonal direction Y, X-axis slider 42 is moved integrally with Y-axis slider 41 in orthogonal direction Y, and is moved in conveyance direction X of board 2 with respect to the Y-axis slider 41 by X-axis servo motor 42a.

Z-axis moving mechanism 43 is a mechanism for moving mounting head 44 in vertical direction Z relative to main body section 10 of component mounting machine 1. Z-axis moving mechanism 43 includes Z-axis table 43a and Z-axis servo motor 43b. Z-axis table 43a is attached to X-axis slider 42 so as to be movable in a direction orthogonal to both conveying direction X and orthogonal direction Y (hereinafter, referred to as vertical direction Z). Z-axis servo motor 43b is fixed to X-axis slider 42. Z-axis servo motor 43b can move Z-axis table 43a in the vertical direction Z with respect to X-axis slider 42.

Z-axis moving mechanism 43 is capable of moving mounting head 44 between upper end Hu and lower end Hd. Hereinafter, Z-axis moving mechanism 43 is assumed to position mounting head 44 at one of the two positions, upper end Hu and lower end Hd. Z-axis moving mechanism 43 is provided to widen the vertical Z-stroke range of suction nozzle 70, which will be described later, attached to mounting head 44. With Z-axis moving mechanism 43, since the stroke range in the vertical Z direction of suction nozzle 70 can be widened when transferring the component from pickup position L to the mounting position on board 2, component transfer can be realized for a wide range of component heights without interfering with components on board 2. For example, transfer of a component having a tall component height is performed with mounting head 44 positioned at upper end Hu. Further, transfer of a component having a low component height is performed with mounting head 44 positioned at lower end Hd.

Z-axis table 43a moves to a position in conveyance direction X in accordance with the movement of X-axis slider 42 in conveyance direction X, moves to a position in orthogonal direction Y in accordance with the movement of Y-axis slider 41 in orthogonal direction Y, and further moves to a position in the vertical direction Z by Z-axis servo motor 43b. Mounting head 44 is attached to Z-axis table 43a. Mounting head 44 moves in conveyance direction X with respect to main body section 10 by X axis servo motor 42a of X axis slider 42, moves in orthogonal direction Y by Y-axis servo motor 41a of Y-axis slider 41, and moves in vertical direction Z by Z-axis servo motor 43b of Z-axis moving mechanism 43.

Mounting head 44 includes head main body 50, nozzle raising and lowering and rotating device 60, and suction nozzle 70. Head main body 50 is fixed to Z-axis table 43a. Suction nozzle 70 is a nozzle that picks up and holds a component at a lower end portion of the nozzle, which is the tip end of the nozzle, via negative pressure or the like. Suction nozzle 70 picks up a component supplied to pickup position L of component supply device 30 using negative pressure or the like, and mounts the component on the mounting position on board 2 by releasing the suction holding component. Note that, head main body 50 may be capable of holding multiple suction nozzles 70 at the same time. Also, mounting head 44 may also have a gripping chuck to grip and hold a component instead of or in addition to suction nozzle 70 that picks up the component via suction.

Nozzle raising and lowering and rotating mechanism 60 is a mechanism for moving suction nozzle 70 vertically in the Z direction with respect to the head main body 50 and for rotating suction nozzle 70. Nozzle raising and lowering and rotating mechanism 60 has raising and lowering shaft 61. Raising and lowering shaft 61 is a syringe held by head main body 50 such that the syringe can be raised and lowered and rotated about the Z axis. Suction nozzle 70 is mounted on the distal end side (that is, the lower end side) of raising and lowering shaft 61, and moves up and down with respect to head main body 50 or rotates around the Z-axis in accordance with movement of raising and lowering shaft 61. Further, suction nozzle 70 moves with respect to main body section 10 in any of conveyance direction X, orthogonal direction Y, and vertical direction Z in accordance with the movement of head main body 50.

Nozzle raising and lowering and rotating mechanism 60 includes first raising and lowering device 62, second raising and lowering device 63, and rotation device 64. First raising and lowering device 62 is a device for raising and lowering raising lowering shaft 61 with respect to head main body 50. First raising and lowering device 62 includes first linear motor 62a, first raising and lowering driving member 62b, and the like. Second raising and lowering device 63 is a device for raising and lowering suction nozzle 70 with respect to raising and lowering shaft 61. Second raising and lowering device 63 includes second linear motor 63a, second raising and lowering driving member 63b, roller 63c, load cell 63d, and biasing spring 63e. Rotation device 64 is a device that rotates raising and lowering shaft 61 with respect to head main body 50. Rotation device 64 is composed of rotation motor 64a and the like.

Head main body 50 includes shaft holding section 51, motor holding section 52, and guide 53. Shaft holding section 51 is a portion for holding raising and lowering shaft 61 so as to be capable of being raised, lowered, and rotated. Motor holding section 52 is a portion that fixedly holds first linear motor 62a. Guide 53 is provided in a pair, and is a portion for guiding the raising and lowering by first raising and lowering driving member 62b.

Figure 3:
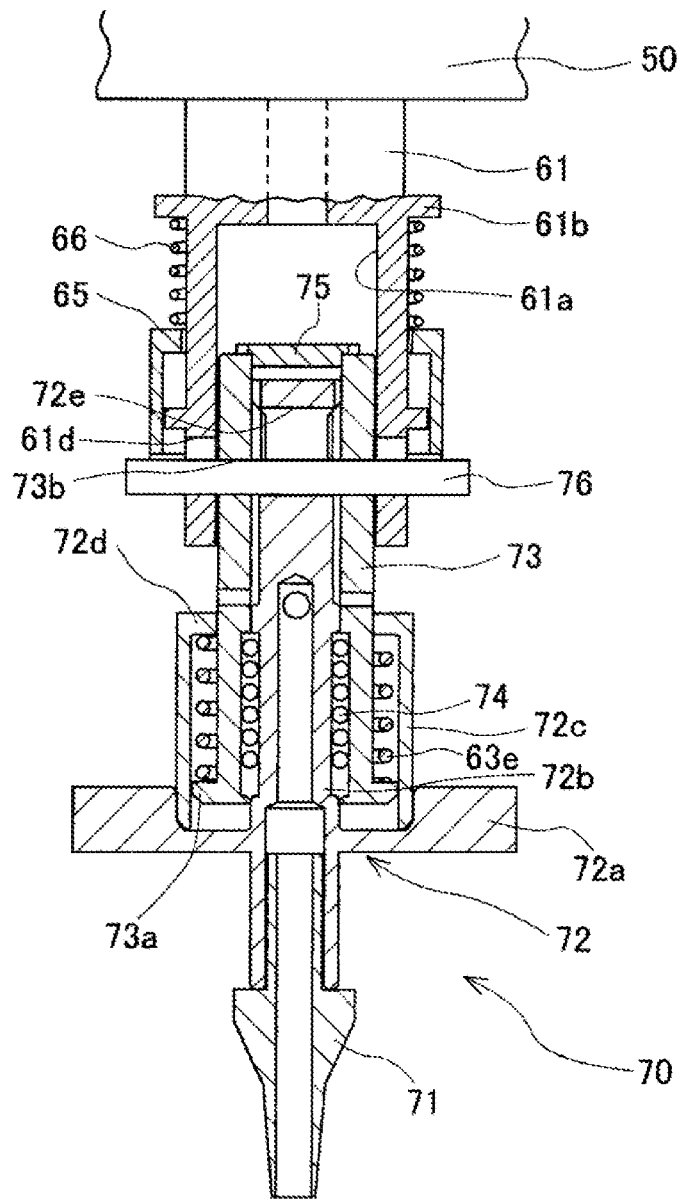
FIG. 3 is a partial cross section of a suction nozzle and surrounding items of the mounting head of the component transfer device of the embodiment seen from a sideways direction.

Suction nozzle 70 includes nozzle section 71, flange section 72, and holder section 73. Suction nozzle 70 is detachably (exchangeably) attached to raising and lowering shaft 61. Nozzle section 71 is formed in a tubular shape, and is capable of picking up and holding a component at a lower end section. As shown in FIG. 3, flange section 72 includes disk section 72a, shaft 72b, and spring holding tube 72c. Shaft 72b is formed integrally the disk section 72a, and penetrates the center of disk portion 72a. Nozzle section 71 is fitted to the lower end section of shaft 72b. Spring holding cylinder 72c is formed in a cylindrical shape, and is fixedly attached to the upper surface of disk section 72a.

Holder section 73 is formed in a hollow cylindrical shape. The lower inner wall of holder portion 73 is formed with a bearing groove extending along the axial direction. Further, a bearing groove extending axially is formed on the outer wall of shaft 72b above disk section 72a. Bearing 74 is fitted between the bearing groove of holder section 73 and the bearing groove of shaft 72b. Flange section 72 is held so as to be able to move up and down with respect to holder section 73.

Cover 75 is attached to the upper end of holder section 73. The upper section of holder section 73 is inserted into mounting hole 61a opening downward to the lower end of raising and lowering shaft 61. Holder section 73 is detachably mounted on raising and lowering shaft 61 with its upper portion inserted into mounting hole 61a. Holder section 73 is fitted into raising and lowering shaft 61 separated by an O-ring or the like. An O-ring may be interposed between holder section 73 of suction nozzle 70 and raising and lowering shaft 61. The outer periphery of the lower portion of holder section 73 is covered with spring holding cylinder 72c of flange section 72. Outer flange section 73a protruding radially outward is provided at the lower end of holder section 73. Inner flange section 72d protruding radially inward is provided at the upper end of spring holding cylinder 72c. Biasing spring 63e is arranged between outer flange section 73a of holder section 73 and inner flange section 72d of spring holding cylinder 72c. Biasing spring 63e is a compressed coil spring supported at both ends by outer flange section 73a and inner flange section 72d.

Elongated hole 72e is provided in the upper section of shaft 72b of flange section 72. Elongated long hole 72e penetrates the side wall of shaft 72b and is formed so as to be vertically long. Holder section 73 is provided with a pair of holes 73b at positions facing elongated hole 72e of shaft 72b. Locking pin 76 is inserted through long hole 72e and pair of holes 73b. Locking pin 76 is fixed to holder section 73.

Pair of J-slots 61d are provided on the side wall of the lower end of raising and lowering shaft 61. The pair of J-slots 61d are opposed to each other with the axial center of raising and lowering shaft 61 interposed therebetween. J-slot 61d opens to the lower end of raising and lowering shaft 61, and is formed in a J shape extending upward from its opening, turning circumferentially, and then slightly extending downward. Both end portions of locking pin 76 protruding from holder section 73 are engaged with the pair of J-slots 61d.

Locking ring 65 and coil spring 66 are fitted on the outer periphery of the lower end of raising and lowering shaft 61. Outer flange section 61b protruding radially outward is provided at the center section of raising and lowering shaft 61. Coil spring 66 is a compressed coil spring arranged between the upper surface of locking ring 65 and outer flange section 61b of raising and lowering shaft 61. When suction nozzle 70 is not attached to raising and lowering shaft 61, locking ring 65 is positioned at a position where the gravitational force of locking ring 65 and the biasing force of coil spring 66 are balanced with respect to raising and lowering shaft 61.

Attaching of suction nozzle 70 to raising and lowering shaft 61 is realized by fixing the engagement of locking pin 76 to J-slot 61d via the following procedure. First, the upper section of holder section 73 of suction nozzle 70 is inserted into mounting hole 61a of raising and lowering shaft 61, locking pin 76 is inserted into and engaged with J-slot 61d of raising and lowering shaft 61 from below, and moved to the innermost portion thereof along the extension direction of J-slot 61d. In the process of moving locking pin 76, locking pin 76 abuts against the lower surface of locking ring 65, and pushes up locking ring 65 against the spring force of coil spring 66. Then, locking pin 76 reaches the seating section at the rearmost section of J-slot 61d. When locking pin 76 reaches the seating section of J-slot 61d, locking pin 76 is pushed downward by the spring force of coil spring 66 on the lower surface of locking ring 65. The engagement of locking pin 76 with J-slot 61d is fixed by the pressing of coil spring 66 due to the spring force, whereby suction nozzle 70 is attached to raising and lowering shaft 61.

Further, releasing of suction nozzle 70 from raising and lowering shaft 61 is realized by releasing the engagement of locking pin 76 to J-slot 61d via the following procedure. First, locking pin 76 of suction nozzle 70 pushes up locking ring 65 against the spring force of coil spring 66 from the seating section of J-slot 61d and moves up to the opening along the extending direction of J-slot 61d. In the process of moving locking pin 76, the spring force of coil spring 66 acting on locking pin 76 becomes zero. Thus, the engagement of locking pin 76 with J-slot 61d is released, and the upper portion of holder section 73 is released from mounting hole 61a of raising and lowering shaft 61, whereby suction nozzle 70 is removed from raising and lowering shaft 61.

Up and down movement of holder section 73 of suction nozzle 70 with respect to raising and lowering shaft 61 is regulated and rotation is also regulated. On the other hand, flange section 72 can be moved up and down with respect to holder section 73 and raising and lowering shaft 61 in the movable range of locking pin 76 in elongated hole 72e (that is, the difference between the length of elongated hole 72e and diameter of locking pin 76). Biasing spring 63e biases flange section 72 upward with respect to holder section 73, and thus raising and lowering shaft 61. By this, flange section 72 is positioned at the upper end in the above-mentioned movable range.

In nozzle raising and lowering and rotating mechanism 60, first raising and lowering driving member 62b is attached to first linear motor 62a. First raising and lowering driving member 62b extends in the Z-direction along the axis of raising and lowering shaft 61 on the outer side of shaft holding section 51 of head main body 50. Engaging section 62c is provided in a center section in the vertical direction of first raising and lowering driving member 62b. Engaging section 62c is engaged with flange section 61c of raising and lowering shaft 61. Second linear motor 63a is held at a lower end of the first raising and lowering driving member 62b. First linear motor 62a is capable of raising and lowering both raising and lowering shaft 61 and second linear motor 63a by first raising and lowering driving member 62b.

Second raising and lowering driving member 63b is attached to second linear motor 63a. Second raising and lowering driving member 63b extends in the Z-axis direction along the axis of suction nozzle 70. Load cell 63d is arranged in a center section in the vertical direction of second raising and lowering driving member 63b. Roller 63c is rotatably held at a lower end of second raising and lowering driving member 63b. Roller 63c contacts the upper surface of disk portion 72a of flange section 72. Second linear motor 63a is capable of raising and lowering both load cell 63d and roller 63c by second raising and lowering driving member 63b.

Second linear motor 63a is capable of pressing the upper surface of disk portion 72a of flange section 72 downward against the biasing force of biasing spring 63e by roller 63c. When roller 63c exerts pressure, flange section 72 is lowered with respect to holder portion 73. When the pressing force of roller 63c becomes small, flange section 72 rises with respect to holder portion 73 by the biasing force of biasing spring 63e. That is, second linear motor 63a raises and lowers suction nozzle 70 with respect to raising and lowering shaft 61. Load cell 63d detects a pressing force in the Z-direction when roller 63c presses disk portion 72a. The detected pressing force on load cell 63d is the sum of the upward force acting on suction nozzle 70 by the biasing force of biasing spring 63e and the upward force acting on suction nozzle 70 from the board side through the component when the component is mounted on board 2.

The rotation of rotation motor 64a is transmitted to raising and lowering shaft 61 while allowing raising and lowering shaft 61 to move up and down. Raising and lowering shaft 61 rotates by the rotation of rotation motor 64a. The rotation of raising and lowering shaft 61 is transmitted to suction nozzle 70 by the engagement of locking pin 76 with J-slot 61d and the rotation of bearings 74. Suction nozzle 70 rotates by rotating raising and lowering shaft 61.

Mounting head 44 performs the following operation such that when the component picked up by suction nozzle 70 is mounted on the board, the component is not impacted by an excessive force. Specifically, first, first lifting and lowering driving member 62b is lowered by driving first linear motor 62a, whereby raising and lowering shaft 61 and second linear motor 63a are lowered. Further, second raising and lowering driving member 63b and roller 63c are lowered by the driving of second linear motor 63a, whereby suction nozzle 70 is pushed down. Note that, in this operation, rotation motor 64a may rotate raising and lowering shaft 61 and thus suction nozzle 70 as required, thereby changing or correcting the rotational attitude of the component held by suction nozzle 70.

Multiple types of suction nozzles 70 are provided in accordance with the sizes and types of components. The multiple types of suction nozzles 70 are configured such that, for example, outer diameters of the suction nozzles 70 differ from each other. Suction nozzle 70 is detachably attached to raising and lowering shaft 61. Mounting head 44 is configured such that suction nozzle 70 attached to head main body 50 can be automatically exchanged. The suction nozzle 70 to be attached to head main body 50 is automatically exchanged by selecting the suction nozzle 70 according to the size of the component to be picked up.

Figure 4:
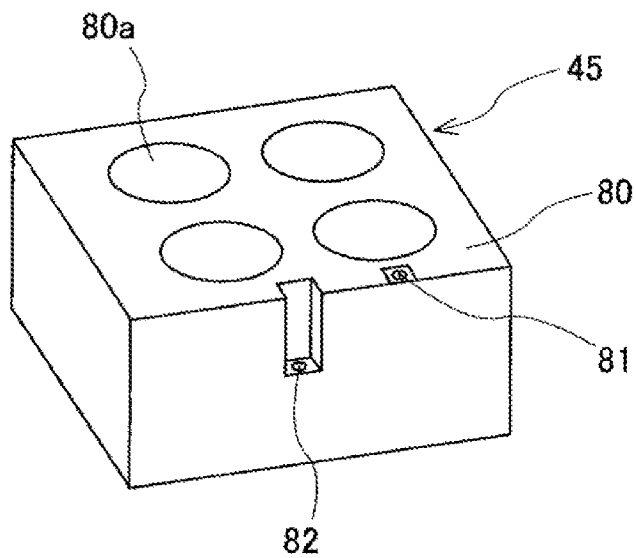
FIG. 4 is a perspective view of a nozzle station of the component transfer device of the embodiment.

Nozzle station 45 is provided between board conveyance device 20 and component supply device 30. Nozzle station 45 stores exchange-use suction nozzles 70. Nozzle station 45 has substantially cuboid housing container 80, as shown in FIG. 4. Housing container 80 has multiple nozzle housing holes 80a so as to house multiple suction nozzles 70. One of the multiple nozzle housing holes 80a is empty so as to be able to house the suction nozzle 70 detached from raising and lowering shaft 61.

Multiple (in the present embodiment two) reference marks, 81 and 82, are provided on housing container 80. Reference marks 81 and 82 are arranged so as to have predetermined positional relationships with respect to nozzle housing holes 80a in both conveyance direction X and orthogonal direction Y. Reference mark 81 and reference mark 82 are formed at positions different from each other on the XY plane, and are formed at positions different from each other in the vertical direction Z. The height position of reference mark 81 is higher than the height position of reference mark 82. The height difference between the height position of reference mark 81 and height position of reference mark 82 is larger than the depth of field of the first camera, which will be described later. Hereinafter, reference mark 81 is referred to as first reference mark 81 and reference mark 82 is referred to as second reference mark 82.

Figure 5:
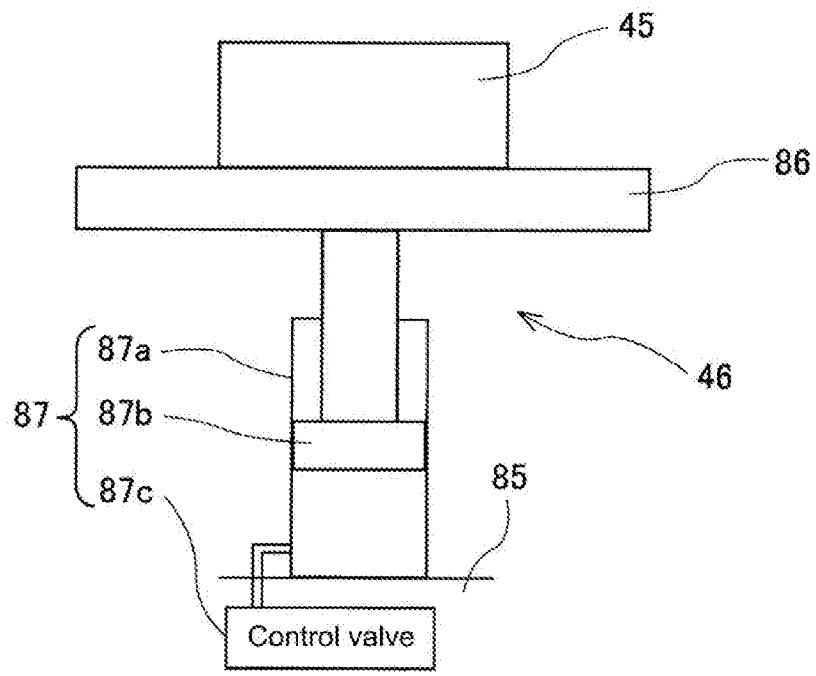
FIG. 5 is a configuration diagram of a nozzle changer that raises and lowers the nozzle station of the component transfer device of the embodiment.

Nozzle changer 46 is a raising and lowering mechanism for raising and lowering nozzle station 45 in the vertical direction Z. As shown in FIG. 5, nozzle changer 46 has main body section 85, raising and lowering table 86, and cylinder device 87. Main body section 85 is attached to main body section 10 of component mounting machine 1. Raising and lowering table 86 is a table that is guided on main body section 85 so as to be able to move up and down via a guide member. The above-mentioned nozzle station 45 is mounted on raising and lowering table 86 via positioning pins or the like. Note that, nozzle station 45 may be detachable from raising and lowering table 86.

Cylinder device 87 is an expanding device for raising and lowering raising and lowering table 86 with respect to main body section 85 to position nozzle station 45 in the height direction. Cylinder device 87 is capable of positioning nozzle stations 45 at multiple (in the present embodiment, two) height positions, S0 and S1. Height position S0 is a lower end position at which interference with the tip end of suction nozzle 70 cannot occur when suction nozzle 70 performs component pickup and mounting. Height position S1 is an upper end position, higher than height position S0, at which interference with the tip end of suction nozzle 70 may occur when suction nozzle 70 performs component pickup and mounting. Hereinafter, height position S0 is referred to as lower end position S0 and height position S1 is referred to as upper end position S1. Note that, reference marks 81 and 82 of housing container 80 described above are provided in a quantity corresponding to the quantity of height positions S0 and S1 at which nozzle station 45 is positioned, more specifically, two, and are provided at different heights corresponding to the height positions S0 and S1.

Cylinder device 87 includes tubular cylinder 87a, rod-shaped piston rod 87b, and control valve 87c. Piston rod 87b of cylinder 87a is slidably fitted to cylinder 87a. Control valve 87c is provided on a path between the working chamber and the high-pressure source separated by piston rod 87b in cylinder 87a, and is an opening and closing valve for controlling the pressure of the working chamber. Cylinder device 87 adjusts the position of piston rod 87b in cylinder 87a by pressure-control by means of control valve 87c, thereby positioning raising and lowering table 86 and thus nozzle station 45 at one of the two height positions S0 and S1.

First camera 47 is fixed to head main body 50 of mounting head 44. First camera 47 is arranged such that its optical axis faces downward. First camera 47 is capable of imaging board 2, reference marks 81 and 82 of nozzle station 45, and the like from above. Images captured by first camera 47 are used to acquire position data of board 2 and nozzle station 45. The obtained position data is used for position control and attitude control when suction nozzle 70 performs component pickup and mounting.

Second camera 48 is fixed to main body section 10 of component mounting machine 1. Second camera 48 is arranged such that its optical axis faces upward. Second camera 48 is capable of capturing an image of a component held by suction nozzle 70 from below. Images captured by second camera 48 are used to acquire positional data of the held component with respect to suction nozzle 70. The obtained position data is used for position control and attitude control when suction nozzle 70 performs component pickup and mounting.

Control device 49 is configured mainly from a computer including a CPU, ROM, RAM, and the like. Control device 49 is connected to Y-axis servo motor 41a, X-axis servo motor 42a, Z-axis servo motor 43b, first linear motor 62a, second linear motor 63a, load cell 63d, control device 64a, control valve 87c, first camera 47, and second camera 48.

For operating component transfer device 40, control device 49 can acquire data transmitted from load cell 63d or the like, and image data transferred from first camera 47 and second camera 48. Control device 49 processes the acquired image data to detect positional information of nozzle station 45, positional information of components, and the like. Based on the detected positional data, control device 49 performs pickup and mounting processing for picking up and mounting the component using suction nozzle 70, and also performs exchanging processing for causing mounting head 44 to automatically exchange suction nozzle 70.

Control device 49 drives motors 41a, 42a, 43b, 62a, 63a, and 64a, respectively, such that suction nozzle 70 is moved to the required position (X, Y, Z position) during pickup and mounting processing and exchanging processing. Each motor 41a, 42a, 43b, 62a, 63a, 64a is driven in accordance with drive commands from control device 49. When the respective motors 41a, 42a, 43b, 62a, 63a, 64a are driven, mounting head 44 is moved to an XYZ position by moving Y-axis slider 41, X-axis slider 42, and Z-axis table 43a, and suction nozzle 70 of mounting head 44 is moved up and down in the vertical direction Z by moving first raising and lowering driving member 62b and second raising and lowering driving member 63b and rotation by the rotation of raising and lowering shaft 61.

Further, in the above exchanging processing, control device 49 sets the height of nozzle station 45 to any one of the height positions S0 and S1, and performs operation control of control valve 87c such that the set height is realized, as described in detail below. Specifically, nozzle station 45 is positioned at the lower end position S0 so as to avoid interfering with operation of mounting head 44 or suction nozzle 70 during a time other than the above-mentioned exchanging processing (for example, during pickup and mounting processing). On the other hand, nozzle station 45 is positioned at any one of the lower end position S0 and the upper end position S1 during the above exchanging processing.

Control device 49 closes control valve 87c when the positioning of nozzle station 45 to lower end position S0 is requested. When control valve 87c is closed, the pressure guided to the working chamber in cylinder 87a is low, such that raising and lowering table 86 does not rise and nozzle station 45 is held at lower end position S0. On the other hand, when positioning of nozzle station 45 to upper end position S1 is requested, control valve 87c is opened. When control valve 87c is opened, high pressure is guided to the working chamber in cylinder 87a, such that raising and lowering table 86 rises to position nozzle station 45 at upper end position S1.

2. Operation of the Component Mounting Machine

In component mounter 1, the suction mounting process by the suction nozzle 70 is performed in accordance with a manufacturing job in which a predetermined part is to be mounted on the board 2, with the nozzle station 45 positioned at the lower end position S0. Lower end position S0 is, as described above, a position where interference cannot occur the tip end of suction nozzle 70 that picks up and mounts the component. Therefore, it is possible to prevent the tip end of suction nozzle 70 and nozzle station 45 from interfering with each other when suction nozzle 70 performs the pickup and mounting processing.

Further, during the pickup and mounting processing by suction nozzle 70, suction nozzle 70 can be moved up and down with respect to head main body 50 by the nozzle raising and lowering and rotating mechanism 60, and head main body 50 can be moved up and down with respect to main body section 10 of component mounting machine 1 by Z-axis moving mechanism 43. In this case, suction nozzle 70 can move up and down by an amount obtained by adding the amount of the stroke by nozzle raising and lowering and rotating mechanism 60 of mounting head 44 and the amount of the stroke of the overall mounting head 44 by Z-axis moving mechanism 43. According to this structure, compared with a structure in which suction nozzle 70 is raised and lowered only by nozzle raising and lowering and rotating mechanism 60 of mounting head 44, the stroke range in which suction nozzle 70 can be raised and lowered in the vertical direction Z can be widened. For this reason, when the component is transferred from pickup position L to the mounting position on board 2, the range of the component height of the component which can be mounted on board 2 by pickup and mounting by suction nozzle 70 can be widened, such that components corresponding to a large component height range, from small to large components, can be appropriately transferred from pickup position L to the mounting position on board 2.

Also, the process of exchanging suction nozzle 70 with respect to mounting head 44 is performed in accordance with the manufacturing job in which predetermined components are to be mounted on board 2. This exchange processing is performed when the size and type of a component to be mounted on the same board 2 is switched, or when switching the size and type of a component in accordance with switching the type of board 2. Immediately before the start of exchange processing of suction nozzle 70, mounting head 44 is held at raising and lowering position H corresponding to the component height of the component mounted on board 2 in the immediately prior pickup and mounting processing, and nozzle station 45 is held at lower end position S0. Mounting head 44 can be moved up and down by moving Z-axis table 43a up and down by Z-axis moving mechanism 43 with suction nozzle 70 attached. Further, nozzle station 45 can be raised and lowered by raising and lowering raising and lowering table 86 by cylinder device 87 of nozzle changer 46 with exchange-use suction nozzles 70 stored.

When the height position of nozzle station 45 is lower end position S0, even if mounting head 44 is in either of the raising and lowering positions H, that is, upper end Hu and lower end Hd, by Z-axis moving mechanism 43, the distance between the tip end of suction nozzle 70 attached to mounting head 44 and nozzle station 45 in the vertical direction Z is sufficiently secured, and suction nozzle 70 can be raised and lowered in mounting head 44 by the raising and lowering of nozzle raising and lowering and rotating mechanism 60. Therefore, in lower end position S0 of nozzle station 45, when suction nozzle 70 attached to mounting head 44 and suction nozzle 70 stored in nozzle station 45 are exchanged, interference can be avoided between nozzle station 45 and the suction nozzle 70 attached to mounting head 44 or mounting head 44.

When the raising and lowering position H of mounting head 44 is upper end Hu when the height position of nozzle station 45 is lower end position S0, the distance between the tip end of suction nozzle 70 attached to mounting head 44 and nozzle station 45 in the vertical direction Z may become excessively large, such that the suction nozzle 70 attached to mounting head 44 cannot be exchanged. At upper end Hu of mounting head 44, even if suction nozzle 70 is positioned at the lower end in mounting head 44 by nozzle raising and lowering and rotating mechanism 60, the tip end of suction nozzle 70 may not reach nozzle station 45 at lower end position S0, such that this configuration does not allow suction nozzle 70 to be exchanged.

Figures 6, 7:
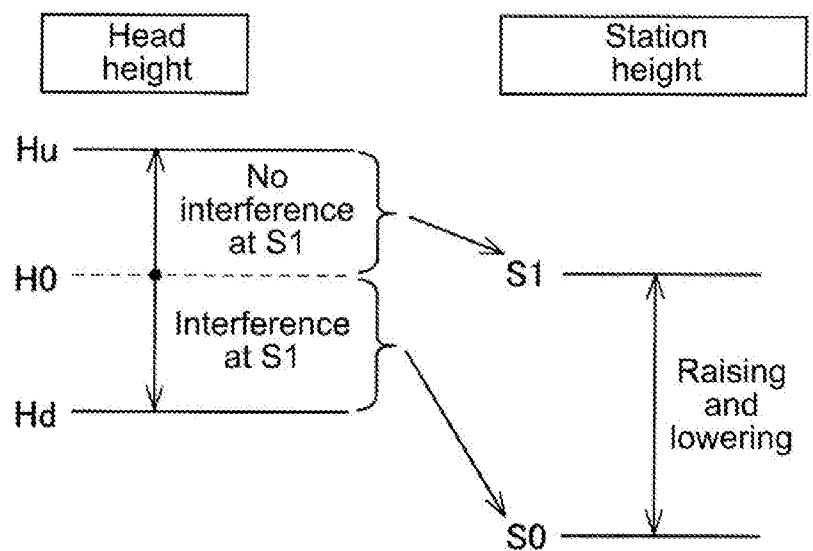
FIG. 6 illustrates a relationship between the head height and the station height during exchange of a nozzle in the embodiment.
FIG. 7 is a table of nozzle station heights in accordance with the head heights set during suction nozzle exchange used by the control device of the component transfer device of the embodiment.

Further, when the height position of nozzle station 45 is upper end position S1, as shown in FIG. 6, depending on the raising and lowering position H of mounting head 44, the distance between the tip end of suction nozzle 70 attached to mounting head 44 and nozzle station 45 in the vertical direction Z becomes smaller than the required distance, such that suction nozzle 70 and nozzle station 45 may interfere when the suction nozzle 70 attached to mounting head 44 is exchanged. Specifically, when mounting head 44 is positioned and upper end Hu, the above-mentioned separation distance becomes equal to or greater than the necessary distance, allowing the exchange of suction nozzle 70 to be appropriately performed while avoiding the above-mentioned interference, while when mounting head 44 is located at the lower end Hd, the above-mentioned separation distance becomes less than the necessary distance, whereby the above-mentioned interference occurs and exchange of suction nozzle 70 cannot be appropriately performed.

That is, when the height position of nozzle station 45 is upper end position S1, as shown in FIG. 6, it is determined whether the exchange of suction nozzle 70 attached to mounting head 44 can be appropriately performed while avoiding interference between the tip end of suction nozzle 70 and nozzle station 45 using the predetermined height position H0 between the upper end Hu and lower end Hd as the height position of mounting head 44.

When mounting head 44 is positioned on the lower end Hd side with respect to predetermined height position H0, only when nozzle station 45 is positioned at lower end position S0 is it possible to appropriately exchange suction nozzle 70 attached to mounting head 44 while avoiding interference between the tip end of suction nozzle 70 and nozzle station 45. Further, when mounting head 44 is positioned at the upper end Hu side with respect to predetermined height position H0, if suction nozzle 70 attached to mounting head 44 is at a height position reaching nozzle station 45, even if the nozzle station 45 is at a height position between lower end position S0 and upper end position S1, it is possible to appropriately exchange suction nozzle 70 attached to mounting head 44 while avoiding the tip end of suction nozzle 70 and nozzle station 45 interfering with each other.

On the other hand, when mounting head 44 is positioned at the upper end Hu side with respect to predetermined height position H0 and nozzle station 45 is positioned at lower end position S0, it is impossible to exchange suction nozzle 70 attached to mounting head 44 as is or it takes longer to perform the exchange. In this case, in order to ensure the exchange of the suction nozzle 70 or to shorten the time required for the exchange, it is appropriate to either lower mounting head 44 to lower end Hd or raise nozzle station 45 to upper end position S1.

Assuming that mounting head 44 is lowered from upper end Hu to lower end Hd in order to exchange suction nozzle 70, mounting head 44 is moved using the following procedure. First, after a component is mounted on board 2 using suction nozzle 70 attached to mounting head 44, mounting head 44 is moved in the XY plane positioned at upper end Hu while avoiding interference with components having a tall component height on board 2, and after mounting head 44 has moved away from above board 2, mounting head 44 is lowered to lower end Hd by Z-axis moving mechanism 43. This increases the movement distance of mounting head 44 required to exchange suction nozzle 70 and thus increases the length of time required to exchange suction nozzle 70. In addition, since the lowering of mounting head 44 to exchange suction nozzle 70 cannot be started until after the mounting of the components on board 2 has been performed by suction nozzle 70 of mounting head 44, the time required for exchanging suction nozzle 70 is further lengthened.

With respect to this, if nozzle station 45 is raised from lower end position S0 to upper end position S1 to exchange suction nozzle 70, nozzle station 45 only moves upwards in order to exchange suction nozzle 70, such that the movement distance is short, and the time required for exchanging suction nozzle 70 is short. Further, even when suction nozzle 70 of mounting head 44 is performing component mounting processing on board 2 or prior to completion of component mounting processing, as long as mounting head 44 and nozzle station 45 do not interfere with each other, nozzle station 45 can started to be raised to exchange suction nozzle 70 mounted on mounting head 44 in accordance with the production job, such that the time required for exchanging suction nozzle 70 is further shortened.

Thus, control device 49 performs the following processing. Specifically, first, control device 49 stores information indicating a predetermined height position (that is, a boundary height position) H0 between upper end Hu and lower end Hd, or information indicating the height position of the nozzle station 45 to be set for each raising/lowering position H of mounting head 44, as a height position serving as a boundary of mounting head 44 as to whether exchange of suction nozzle 70 attached to mounting head 44 can be appropriately performed while avoiding interference between the tip end of suction nozzle 70 and nozzle station 45. For example, as shown in FIG. 7, upper end position S1 of nozzle station 45 is stored as the height position to be set at upper end Hu of mounting head 44, and lower end position S0 of nozzle station 45 is stored as the height position to be set at lower end Hd of mounting head 44.

Control device 49 determines whether exchange processing of suction nozzle 70 with respect to mounting head 44 is required in accordance with the production job (step S100). As a result, if an exchange processing request is not made, subsequent processing is terminated. On the other hand, when exchange processing is requested, first, raising and lowering position H of mounting head 44 at that point in time is identified (step S101). Raising and lowering position H corresponds to the component height of the component mounted on board 2 immediately before exchange processing of suction nozzle 70, and is a height position at which mounting head 44 is held by the Z-axis moving mechanism 43 with respect to main body section 10 when a component of that component height is mounted on board 2.

Control device 49 determines whether raising and lowering position H of mounting head 44 detected in step S101 is either of a position of upper end Hu or lower end Hd (step S102). Further, if control device 49 determines that raising and lowering position H of mounting head 44 is upper end Hu, it sets the height position of nozzle station 45 to upper end position S1, and performs a process of raising nozzle station 45 from lower end position S0 to upper end position S1 (step S103).

Raising processing in the above-described step S103 is performed even when suction nozzle 70 attached to mounting head 44 at upper end Hu reaches nozzle station 45 at lower end position S0. In this raising processing, control valve 87c of cylinder device 87 of nozzle changer 46 is commanded to operate such that raising and lowering table 86 is positioned at upper end position S1. When this raising processing is performed, nozzle station 45 is raised to upper end position S1 and fixed in position.

Further, it is desirable to complete the raising of nozzle station 45 from lower end position S0 to upper end position S1 by the above raising processing until by the time mounting head 44 has moved to a position above the empty nozzle housing hole 80a of housing container 80 of nozzle station 45 for the exchange of suction nozzle 70, in order to shorten the time required for exchanging suction nozzles 70. Raising may be initiated, for example, prior to component mounting on board 2 with the pre-exchange suction nozzle 70 currently attached to mounting head 44, or may be initiated when mounting head 44 is positioned above board 2, in accordance with the timing when interference between mounting head 44 and nozzle station 45 as recognizable from the production job.

On the other hand, if control device 49 determines that raising and lowering position H of mounting head 44 is lower end Hd, it sets the height position of nozzle station 45 to lower end position S0, and performs a process of maintaining nozzle station 45 at lower end position S0 (step S104). Specifically, an operation command is issued to control valve 87c such that raising and lowering table 86 is maintained at lower end position S0. In this case, nozzle station 45 is maintained at lower end position S0.

After controlling the height of nozzle station 45 in step S103 or step S104, control device 49 performs exchange processing of suction nozzle 70 with respect to mounting head 44 in accordance with the height position of nozzle station 45 (step S105). Exchanging of suction nozzle 70 is performed between the suction nozzle 70 attached to mounting head 44 and a suction nozzle 70 stored in nozzle station 45 raised to upper end position S1, when the raising and lowering position H of mounting head 44 is upper end Hu. On the other hand, when the raising and lowering position H of mounting head 44 is lower end Hd, exchange is performed between the suction nozzle 70 attached to mounting head 44 and a suction nozzle 70 stored in nozzle station 45 maintained at lower end position S0.

In this manner, if the height position of nozzle station 45 at the time of exchange is changed in accordance with raising and lowering position H of mounting head 44 immediately before the exchange of suction nozzle 70, during exchange, in alignment with raising and lowering position H of mounting head 44, the vertical Z distance between the suction nozzle 70 attached to mounting head 44 and nozzle station 45 can be shortened as much as possible in a range wherein interference does not occur between mounting head 44 or suction nozzle 70 and the nozzle station 45. Accordingly, it is not necessary to raise or lower the mounting head 44 by Z-axis moving mechanism 43 to avoid interference during exchange of suction nozzles at mounting head 44.

Even when suction nozzle 70 attached to mounting head 44 at upper end Hu is at a height position reaching nozzle station 45 at lower end position S0, exchange of the suction nozzle 70 attached to mounting head 44 at upper end Hu is performed while nozzle station 45 is raised to upper end position S1. In other words, exchange of suction nozzle 70 is performed in a state with the separation distance in vertical direction Z between the suction nozzle 70 attached to mounting head 44 and nozzle station 45 as small as possible. Therefore, the movement time and the movement distance of mounting head 44 required to exchange the suction nozzle 70 with respect to mounting head 44 can be shortened, such that exchange time is shortened and exchange is performed efficiently.

Thus, according to component mounting machine 1 of the present embodiment, exchange of suction nozzle 70 attached to head main body 50 of mounting head 44 can be efficiently performed while reliably avoiding interference between nozzle station 45 and suction nozzle 70 attached to mounting head 44 or the mounting head 44.

Exchange of suction nozzle 70 is performed by the following procedure. First, Y-axis slider 41 and X-axis slider 42 are moved in the XY plane, whereby mounting head 44 is moved above an empty nozzle housing hole 80a of housing container 80 of nozzle station 45. Note that, nozzle station 45 is positioned at lower end position S0 or upper end position S1 by nozzle changer 46 at the same time as mounting head 44 is moved above the empty nozzle housing hole 80a. The positioning of the height of nozzle station 45 is desirably completed prior to the completion of the movement of mounting head 44 above the empty nozzle housing hole 80a, in order to shorten the time required for exchanging suction nozzle 70. Then, by lowering (and rotating as required) raising and lowering shaft 61 using nozzle raising and lowering and rotating mechanism 60, the suction nozzle 70 attached to mounting head 44 at that time is delivered to the empty nozzle housing hole 80a.

Next, while raising and lowering shaft 61 is raised by nozzle raising and lowering and rotation mechanism 60, by Y-axis slider 41 and X-axis slider 42 being moved in the XY plane, mounting head 44 to which the suction nozzle 70 is to be attached is moved above the nozzle housing hole 80a that is housing the relevant suction nozzle 70. Then, by lowering raising and lowering shaft 61 using nozzle raising and lowering and rotating mechanism 60, the suction nozzle 70 housed in the nozzle housing hole 80a is attached to mounting head 44. After the suction nozzle 70 has been attached, raising and lowering shaft 61 is raised by nozzle lifting and lowering and rotating mechanism 60. As a result, automatic exchange of suction nozzle 70 is complete.

Note that, when the suction nozzle 70 attached to mounting head 44 is exchanged, nozzle station 45 is positioned at either lower end position S0 or upper end position S1 by nozzle changer 46. Nozzle changer 46 raises and lowers nozzle station 45 via pressure control using control valve 87c using cylinder device 87. Therefore, with nozzle station 45 in lower end position S0 and upper end position S1, positional deviation may occur not only in the height position of nozzle station 45 in the vertical direction Z, but also in conveyance direction X and in orthogonal direction Y. Accordingly, in order to exchange the suction nozzle 70 attached to mounting head 44 with high positional accuracy, the parameters for correcting the positional relationship between mounting head 44 and nozzle station 45 need to be changed between when nozzle station 45 is in the lower end position S0 and when it is in upper end position S1.

Thus, with component mounting machine 1, when nozzle station 45 is in lower end position S0 and upper end position S1 while being mounted on raising and lowering table 86 of nozzle changer 46, reference marks 81 and 82 provided on housing container 80 of nozzle station 45 are imaged by first camera 47. Reference marks 81 and 82 are imaged when nozzle station 45 is attached to raising and lowering table 86 of nozzle changer 46 (for example, immediately after attachment) or when nozzle station 45 is exchanged (for example, immediately after exchange). Further, each of the reference marks 81 and 82 is imaged separately with head main body 50 of mounting head 44 to which first camera 47 is attached being fixed at any one of the raising and lowering positions H.

When it is time to image reference marks 81 and 82 (step S120 of the routine shown in FIG. 9), control device 49 moves mounting head 44 to which first camera 47 is attached above nozzle station 45 and positions it such that imaging is possible by first camera 47 of reference marks 81 and 82 provided on housing container 80 of nozzle station 45 (step S121).

After the positioning of mounting head 44, control device 49 first positions nozzle station 45 mounted on raising and lowering table 86 at lower end position S0 and causes first camera 47 to image first reference mark 81 in that state (step S122). Upon imaging first reference mark 81 with first camera 47, control device 49 recognizes first reference mark 81 on nozzle station 45 from the image obtained by the imaging, detects the position of first reference mark 81 (step S123), and stores information representing the detected position of first reference mark 81 on nozzle station 45 in memory 49a (step S124).

Next, control device 49 raises and positions nozzle station 45 from lower end position S0 to upper end position S1 using nozzle changer 46, and causes first camera 47 to image second reference mark 82 in that state (step S125). Upon imaging second reference mark 82 with first camera 47, control device 49 recognizes second reference mark 82 on nozzle station 45 from the image obtained by the imaging, detects the position of second reference mark 82 (step S126), and stores information representing the detected position of second reference mark 82 on nozzle station 45 in memory 49a (step S127).

The position information of first reference mark 81 stored in memory 49a is used to correct the positional relationship between mounting head 44 and nozzle station 45 (specifically, the positional relationship in the XY plane) when nozzle station 45 is positioned at lower end position S0 during processing for exchanging suction nozzle 70 with respect to mounting head 44. When exchanging suction nozzle 70 with nozzle station 45 positioned at lower end position S0, control device 49 positions mounting head 44 and nozzle station 45 based on the position of first reference mark 81 stored in memory 49a.

Further, the position information of second reference mark 82 stored in memory 49a is used to correct the positional relationship between mounting head 44 and nozzle station 45 (specifically, the positional relationship in the XY plane) when nozzle station 45 is positioned at upper end position S1 during processing for exchanging suction nozzle 70 with respect to mounting head 44. When exchanging suction nozzle 70 with nozzle station 45 positioned at upper end position S1, control device 49 positions mounting head 44 and nozzle station 45 based on the position of second reference mark 82 stored in memory 49a.

In this manner, with component mounting machine 1, it is possible to change the position information of reference marks 81 and 82 used for correcting the positional relationship between mounting head 44 and nozzle station 45 for when nozzle station is at lower end position S0 and upper end position S1. When the nozzle station 45 is at lower end position S0, the position information of first reference mark 81 is used to correct the positional relationship. When the nozzle station 45 is at upper end position S1, the position information of second reference mark 82 is used to correct the positional relationship.

Thus, according to component mounting machine 1, since the positional deviation in the XY plane of the nozzle station 45 between lower end position S0 and upper end position S1 can be eliminated, the position of suction nozzle 70 can be accurately controlled with respect to nozzle station 45 even if the nozzle station 45 is at any of lower end position S0 and upper end position S1 at the time of exchanging the suction nozzle 70 attached to mounting head 44, and exchange can be performed with high positional accuracy.

Further, in a case in which only one reference mark is provided on nozzle station 45 and the reference mark is imaged using the same camera on the mounting head 44 side for each height position of nozzle station 45, a blurry image due to not being in focus may occur depending on the depth of field of the camera due to the fact that distances between the camera and the reference mark are greatly different between different height positions of nozzle station 45. If blurriness occurs, the position of the reference mark cannot be accurately detected, and as a result, the position control of mounting head 44 and thus suction nozzle 70 with respect to nozzle station 45 is not accurately performed, and the exchange of suction nozzle 70 will not be accurately performed.

In contrast, with component mounting machine 1 of the present embodiment, first reference mark 81, the position of which is detected when nozzle station 45 is at lower end position S0 and which is used for correcting the positional relationship between mounting head 44 and nozzle station 45 at lower end position S0, and the second reference mark 82, the position of which is detected when nozzle station 45 is at upper end position S1 and which is used for correcting the positional relationship between mounting head 44 and nozzle station 45 at upper end position S1, are independently provided on nozzle station 45. These reference marks 81 and 82 are provided at different heights on nozzle station 45. Further, the camera for imaging reference marks 81 and 82 is the same first camera 47 attached to head main body 50 of mounting head 44.

According to this configuration, even if first reference mark 81 is imaged with nozzle station 45 at lower end position S0 and second reference mark 82 is imaged with nozzle station 45 at upper end position S1 using the same first camera 47, the distance between first camera 47 and first reference mark 81 with nozzle station 45 at lower end position S0 and the distance between the first camera 47 and the second reference mark 82 with nozzle station 45 at upper end position S1 can be substantially aligned. Thus, even if the depth of field of first camera 47 is shallow, both of the captured images, of first reference mark 81 with nozzle station 45 at lower end position S0 and of second reference mark 82 with nozzle station 45 at upper end position S1, are free of blurring.

Thus, according to component mounting machine 1, by providing reference marks 81 and 82 at different height positions in accordance with the raising and lowering positions of nozzle station 45, the position of reference marks 81 and 82 can be accurately detected from the captured images even if nozzle station 45 is at either lower end position S0 or upper end position S1, the position of suction nozzle 70 can be accurately controlled with respect to nozzle station 45, and exchange of suction nozzle 70 can be performed with high positional accuracy.

Note that, in embodiments described above, main body section 10 of component mounting machine 1 corresponds to a "component mounting machine main body", suction nozzle 70 corresponds to a "component holding member", Z-axis moving mechanism 43 corresponds to a "head moving mechanism", nozzle station 45 corresponds to a "station", nozzle changer 46 corresponds to a "station moving mechanism", control device 49 corresponds to a "control device", first camera 47 corresponds to a "camera", control device 49 corresponds to a "mark position detecting section" that detects the positions of reference marks 81 and 82 for each height position of nozzle station 45 based on recognition results of reference marks 81 and 82 imaged by first camera 47 at each of the height positions of nozzle station 45, and control device 49 corresponds to a "positioning section" that performs positioning of mounting head 44 and nozzle station 45 during exchange of suction nozzle 70 for each height position of nozzle station 45 based on the positions of reference marks 81 and 82.

3. Alternative Embodiments

Note that, in an above-described embodiment, suction nozzle 70 for picking up a component by negative pressure or the like is used as the component holding member for holding the component. However, the configuration is not limited to this, and the present disclosure may be applied to a case where a gripping chuck for gripping a component is used as the component holding member, or to a case where a pushup pot for pushing up a component such as a die from below is used as the component holding member.

Further, in an embodiment above, Z-axis moving mechanism 43 is used to move mounting head 44 to one of two positions, that is, upper end Hu and lower end Hd. However, the configuration is not limited to this, and the present disclosure may be applied to a configuration in which Z-axis moving mechanism 43 is used to position mounting head 44 at any position of three or more positions between upper end Hu and lower end Hd. For example, mounting head 44 may be configured such that the raising and lowering position is changed to any position between upper end Hu and lower end Hd by Z-axis moving mechanism 43 in accordance with the size of a component to be picked up and mounted on board 2, the size of suction nozzle 70, and the like.

Figure 8:
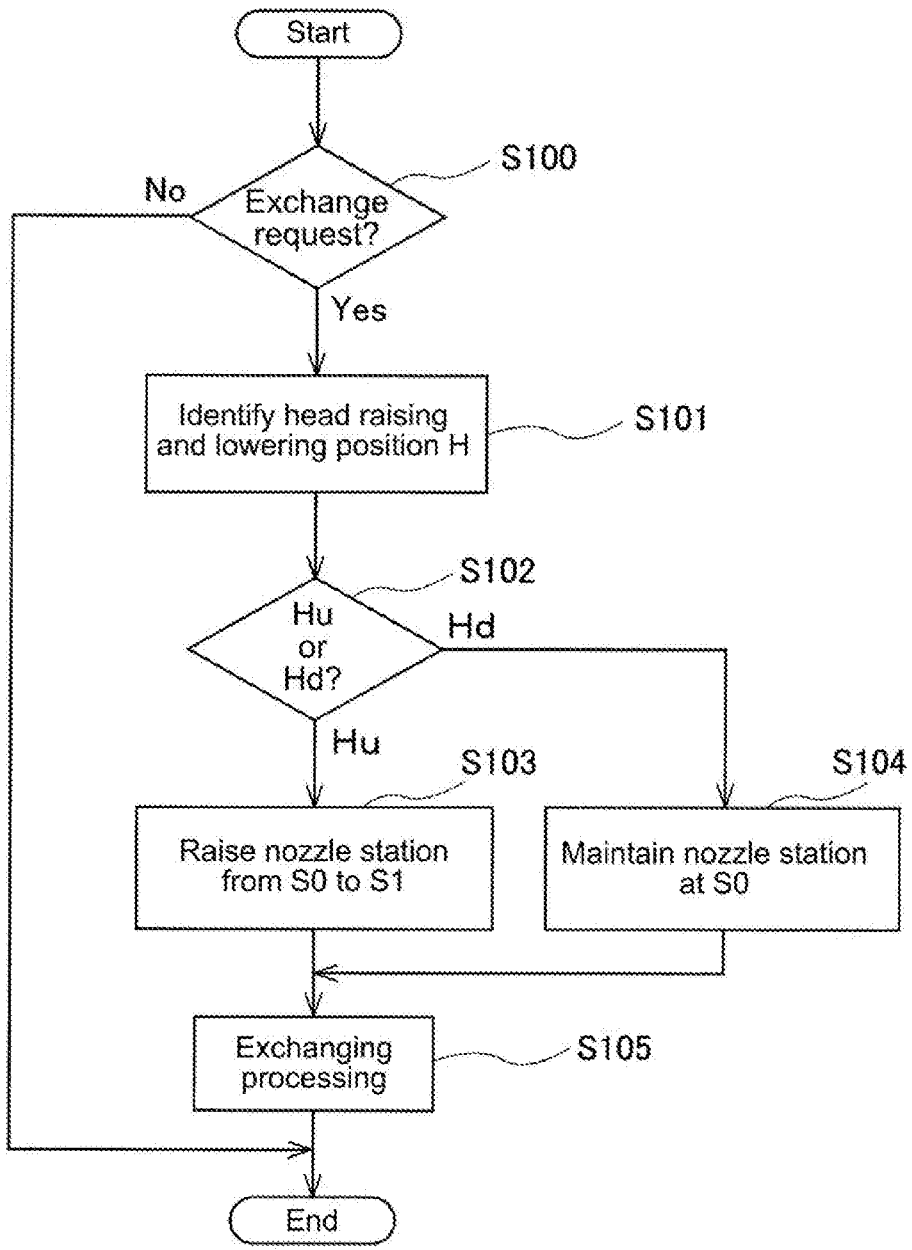
FIG. 8 is a flowchart of an example of a control routine performed when exchanging a suction nozzle by the control device of the embodiment.
Figure 9:
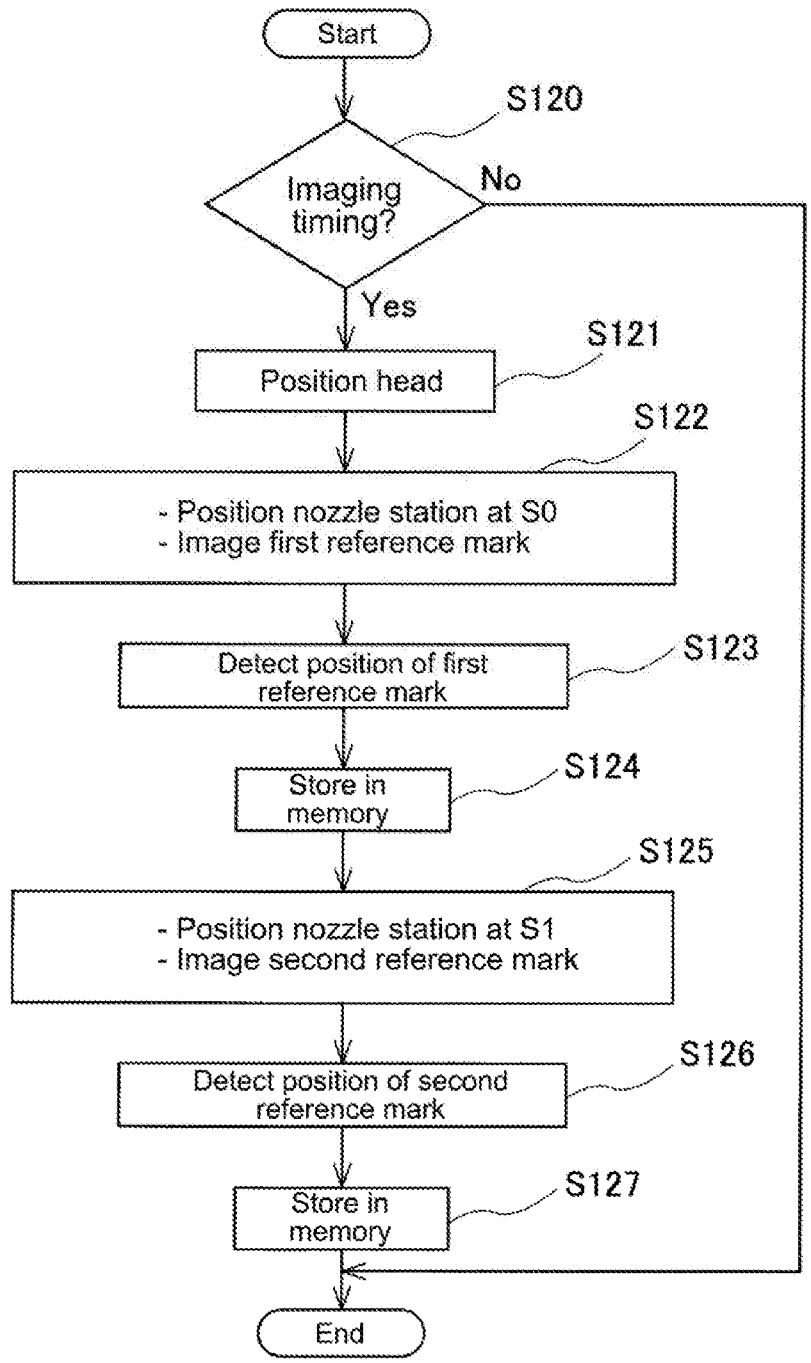
FIG. 9 is a flowchart of an example of a control routine performed when performing position detection of two reference marks provided on the nozzle station by the control device of the embodiment.
Figure 10:
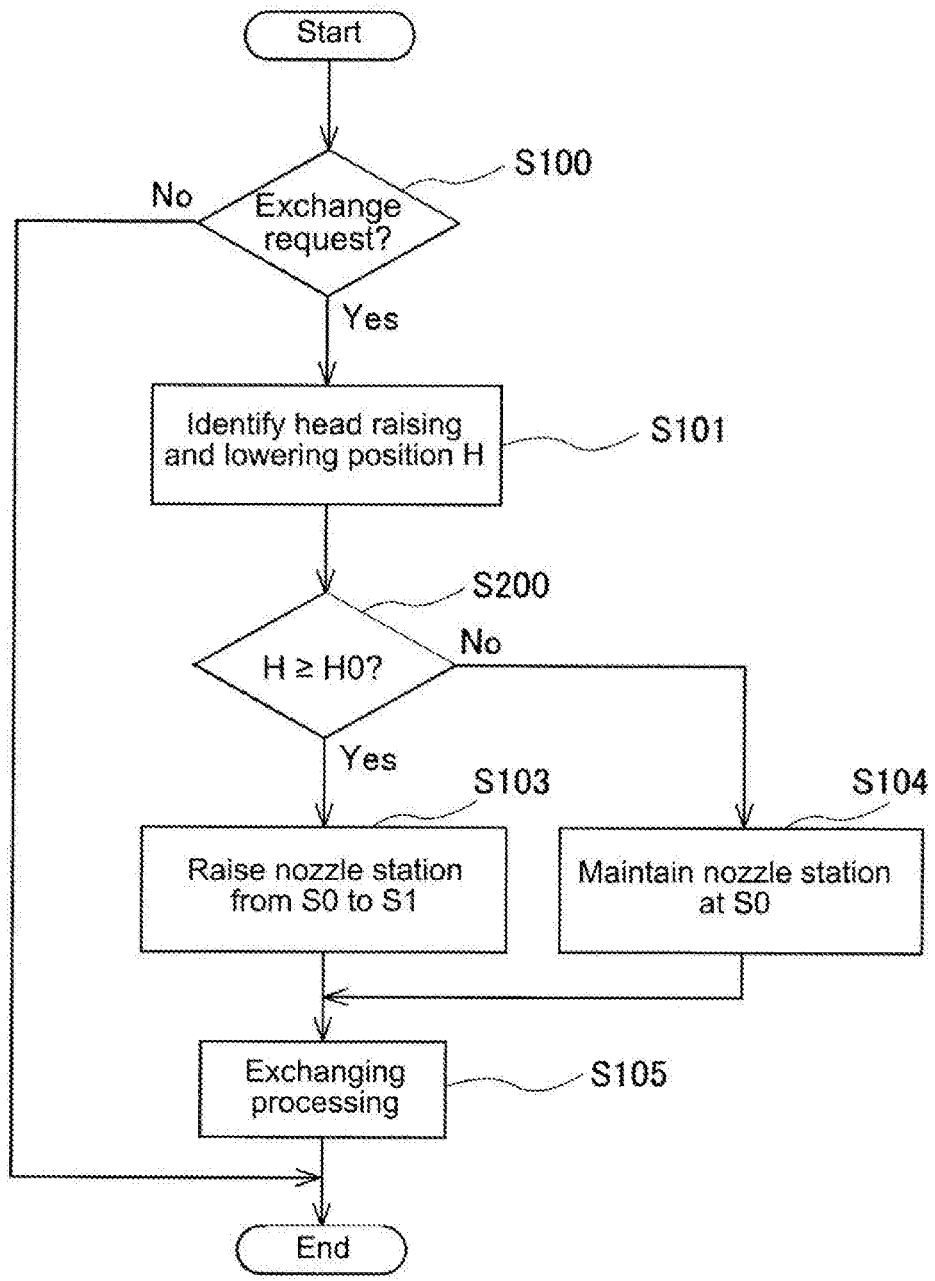
FIG. 10 is a flowchart of an example of a control routine performed when exchanging a suction nozzle by the control device of a component mounting machine of an alternative embodiment.

Such an alternative embodiment, as shown in FIG. 10, may be realized by control device 49 executing the processing of step S200 instead of step S102 in the routine shown in FIG. 8. In other words, control device 49 determines whether the raising and lowering position H of mounting head 44 detected in step S101 is equal to or greater than boundary height position H0, which is the boundary as to whether exchange of suction nozzle 70 attached to mounting head 44 can be appropriately performed while avoiding the interference between the tip end of suction nozzle 70 and nozzle station 45 (step S200). As a result, if control device 49 determines that raising and lowering position H of mounting head 44 is equal to or greater than boundary height position H0, it sets the height position of nozzle station 45 to upper end position S1, and performs a process of raising nozzle station 45 from lower end position S0 to upper end position S1 (step S103). On the other hand, if control device 49 determines that raising and lowering position H of mounting head 44 is less than boundary height position H0, it sets the height position of nozzle station 45 to lower end position S0, and performs a process of maintaining nozzle station 45 at lower end position S0 (step S104).

In this alternative embodiment too, since the height position of nozzle station 45 when exchanging suction nozzle 70 is changed in accordance with raising and lowering position H of mounting head 44, without reaching raising and lowering position H of mounting head 44 during exchange, the vertical Z distance between the suction nozzle 70 attached to mounting head 44 and nozzle station 45 can be shortened as much as possible in a range wherein interference does not occur between mounting head 44 or suction nozzle 70 and nozzle station 45. Accordingly, exchange of suction nozzle 70 attached to mounting head 44 can be efficiently performed while reliably avoiding interference between mounting head 44 or suction nozzle 70 and nozzle station 45.

Further, in an embodiment above, using nozzle changer 46, nozzle station 45 is moved to one of two positions, lower end position S0 and upper end position S1. However, the configuration is not limited to this, and the present disclosure may be applied to a configuration in which nozzle station 45 is positioned at any of three or more positions between lower end position S0 and upper end position S1 using nozzle changer 46. With this configuration, when the height position the mounting head 44 (specifically, head main body 50) is a position at which interference can occur between mounting head 44 and nozzle station 45, control device 49 may set the height position of nozzle station 45 during exchange of suction nozzle 70 to a position at which interference cannot occur, and more specifically, in order to shorten the time required for exchange, the height position of nozzle station 45 during exchange may be set to the uppermost position of the positions at which interference cannot occur.

Note that, the present disclosure is not limited to the above-described embodiments and variations, and various modifications can be made without departing from the spirit and scope of the present disclosure.

REFERENCE SIGNS LIST

1: component mounting machine;
10: main body section;
20: board conveyance device;
30: component supply device;
40: component transfer device;
41: Y-axis slider;
42: X-axis slider;
43: Z-axis moving mechanism;
44: mounting head;
45: nozzle station;
46: nozzle changer;
47: first camera;
49: control device;
50: head main body;
60: nozzle raising and lowering and rotating mechanism;
61: raising and lowering shaft;
70: suction nozzle;
80: housing container;
81, 82: reference mark;
86: raising and lowering table;
87: cylinder device

The invention claimed is:

1. A component mounting machine comprising:
   a head main body attached to a component mounting machine main body to be capable of being raised and lowered, and configured to detachably hold a component holding member that holds a component;
   a z-axis head moving mechanism configured to move the head main body with respect to the component mounting machine main body in a raising and lowering direction;
   a station attached to the component mounting machine main body to be capable of being raised and lowered, the station holds an exchange-use component holding member;
   a station moving mechanism configured to move the station with respect to the component mounting machine main body in the raising and lowering direction; and
   a control device performs an exchange processing of the exchange-use component holding member when a size or a type of the component is switched or requested in accordance with type of a board;
   immediately before starting the exchange processing, the control device determines whether the exchange processing of the component holding member with respect to the head main body is requested, and
   when the exchange processing of the component holding member with respect to the head main body is requested, the control device further identifies a height position of the head main body in the raising and lowering direction with respect to a reference mark provided on the station, and determine whether the height position of the head main body is an upper end position or a lower end position, operate the station moving mechanism to move the station to an upper end position if the height position of the head main body is the upper end position, and maintain the station at a lower end position if the height position of the head main body is the lower end position, wherein the station is at the lower end position immediately before the exchange processing of the component holding member with respect to the head main body is requested, and perform the requested exchange processing of the exchange-use component holding member.

2. The component mounting machine according to claim 1, wherein the station includes multiple reference marks provided on the station at different heights corresponding to the height positions to which movement is possible using the station moving mechanism, the component mounting machine includes a camera provided on the head main body or on the component mounting machine main body, and the control device is further configured to acquire respective positions of the reference marks and detect each height position of the station based on a recognition result of the reference mark corresponding to the acquired image by the camera for each height position of the station, and perform positioning of the station and the head main body during the exchange for each of the height positions of the station based on a detection result of the acquired reference marks by a height position detecting section.

\* \* \* \* \*